United States Patent
Baba

(10) Patent No.: US 9,372,409 B2
(45) Date of Patent: Jun. 21, 2016

(54) EXPOSURE APPARATUS, CONTROL METHOD THEREOF, AND DEVICE FABRICATION METHOD

(71) Applicant: CANON KABUSHIKI KAISHA, Tokyo (JP)

(72) Inventor: Norikazu Baba, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 14/703,967

(22) Filed: May 5, 2015

(65) Prior Publication Data
US 2015/0331327 A1 Nov. 19, 2015

(30) Foreign Application Priority Data
May 13, 2014 (JP) .................. 2014-099827

(51) Int. Cl.
G03B 27/42 (2006.01)
G03B 27/58 (2006.01)
G03F 7/20 (2006.01)

(52) U.S. Cl.
CPC ........ *G03F 7/70058* (2013.01); *G03F 7/70758* (2013.01)

(58) Field of Classification Search
CPC .................. G03F 7/70058; G03F 7/70716
USPC ................................. 355/53, 72–76
See application file for complete search history.

(56) References Cited

U.S. PATENT DOCUMENTS

| 7,016,019 | B2 | 3/2006 | Van Den Biggelaar et al. |
| 8,319,942 | B2 * | 11/2012 | Takano ............... G03B 27/54 355/53 |
| 8,570,490 | B2 * | 10/2013 | Smeets ............... G03B 27/58 355/72 |
| 8,953,141 | B2 * | 2/2015 | Leenders ............ G03F 7/70725 355/30 |
| 2005/0024610 | A1 * | 2/2005 | Nishi ............... G03F 7/70425 355/53 |

FOREIGN PATENT DOCUMENTS

| JP | 2005183966 A | 7/2005 |
| JP | 2010087470 A | 4/2010 |
| JP | 2010147467 A | 7/2010 |

* cited by examiner

*Primary Examiner* — Hung Henry Nguyen
(74) *Attorney, Agent, or Firm* — Rossi, Kimms & McDowell LLP

(57) ABSTRACT

An exposure apparatus advantageous for reducing the driving time of a stage is provided. In the apparatus, an input of an arrangement of exposure shots and an exposure order are received. An input of an upper limit acceleration value and an upper limit velocity value of the stage are received. A target locus of the stage is created using constrained-quadratic-linear programming such that the driving time of the stage from the end of an exposure to the start of the next exposure is within an acceptable value range, based on the input arrangement of exposure shots and exposure order, and the input upper limit acceleration value and upper limit velocity value. A driving unit that drives the stage is controlled based on the created target locus.

8 Claims, 9 Drawing Sheets

F I G. 9
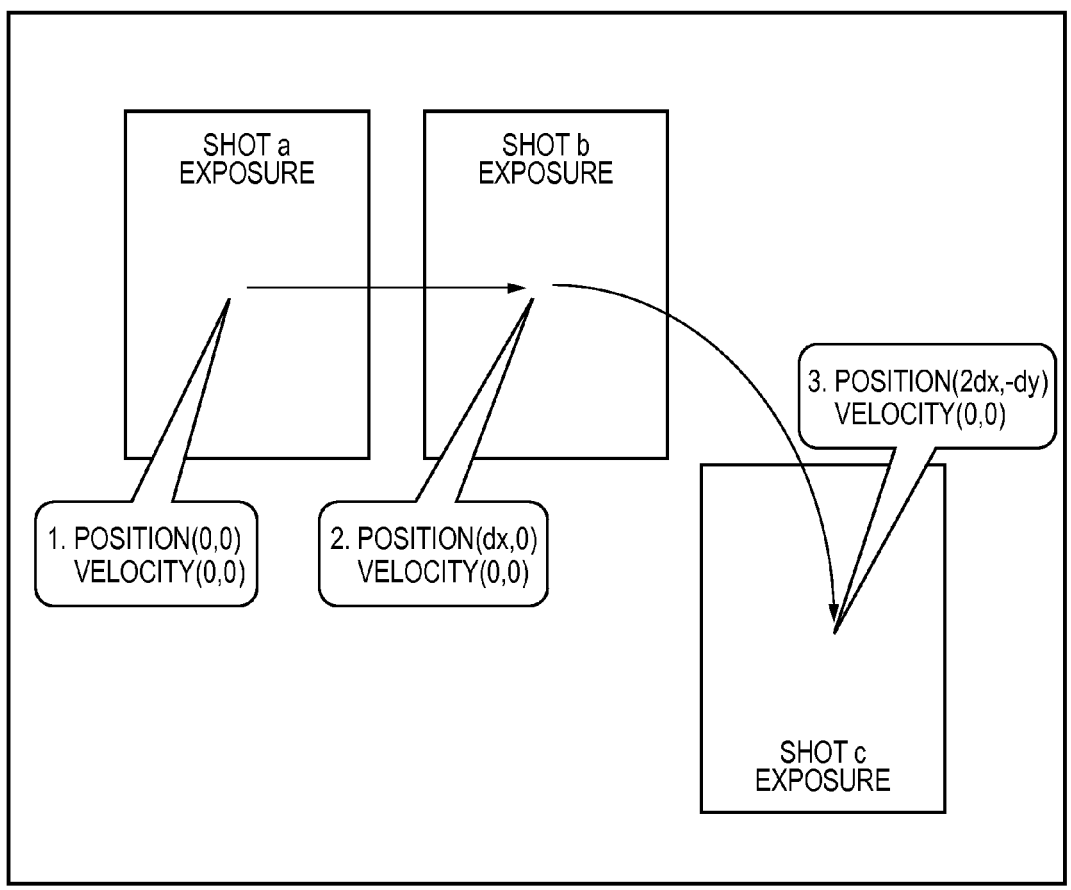

EXPOSURE APPARATUS, CONTROL METHOD THEREOF, AND DEVICE FABRICATION METHOD

BACKGROUND OF THE INVENTION

1. Field of the Invention

The present invention relates to a technique for controlling an exposure apparatus.

2. Description of the Related Art

A semiconductor exposure apparatus uses an XY stage for moving a wafer to a desired position. Data that shows how the XY stage is moved along time is called a "target locus". The target locus of the stage during the period from when an exposure ends to when the next exposure starts needs to satisfy the following three conditions:

(1) a start condition of velocity and position at the end of an exposure;

(2) an end condition of position and velocity at the start of the next exposure; and (3) a constraint condition that the acceleration and velocity for driving the stage should not exceed an upper limit value.

Furthermore, the target locus is required to reduce driving time as low as possible so as to improve productivity. With conventional techniques, for example, Japanese Patent Laid-Open No. 2010-087470 discloses that the start condition and the end condition are satisfied by matching the timing of driving in the X direction with the timing of driving in the Y direction. Japanese Patent Laid-Open No. 2010-147467 discloses that the driving time is shortened by improving the scan velocity during exposure. Furthermore, Japanese Patent Laid-Open No. 2005-183966 discloses that the driving time is shortened by reducing the settling time for improving overlay accuracy.

According to the documents mentioned above, when creating the target locus between exposures, the target locus is created by giving higher priority on satisfying the start condition and the end condition and bringing the velocity and acceleration within the constraint condition. For this reason, none of the documents necessarily guarantees minimization of driving time. Accordingly, it can be said that there is room for improvement in throughput.

SUMMARY OF THE INVENTION

The present invention provides a lithography apparatus that is advantageous in terms of overlay accuracy.

According to one aspect of the present invention, an exposure apparatus comprises a stage configured to hold a target of exposure, a driving unit configured to drive the stage, a shot arrangement input unit configured to receive an input of an arrangement of exposure shots and an exposure order, an upper limit value input unit configured to receive an input of an upper limit acceleration value and an upper limit velocity value of the stage, a creating unit configured to create a target locus of the stage by using constrained-quadratic-linear programming such that a driving time of the stage from end of an exposure to start of a next exposure is within an acceptable value range, based on the input arrangement of exposure shots and exposure order, and the input upper limit acceleration value and upper limit velocity value, and a control unit configured to control the driving unit based on the created target locus.

Further features of the present invention will become apparent from the following description of exemplary embodiments (with reference to the attached drawings).

BRIEF DESCRIPTION OF THE DRAWINGS

FIG. 9 is a diagram showing a shot arrangement, a start condition and an end condition according to the second embodiment.

DESCRIPTION OF THE EMBODIMENTS

Various exemplary embodiments, features, and aspects of the invention will be described in detail below with reference to the drawings.

Hereinafter, preferred embodiments of the present invention will be described in detail with reference to the drawings. It should be noted that the present invention is not limited to any of the embodiments given below, and the following embodiments merely illustrate specific advantageous examples for carrying out the present invention. In addition, not all combinations of the features described in the following embodiments are necessarily required to solve the problems of the present invention.

First Embodiment

Figure 1:
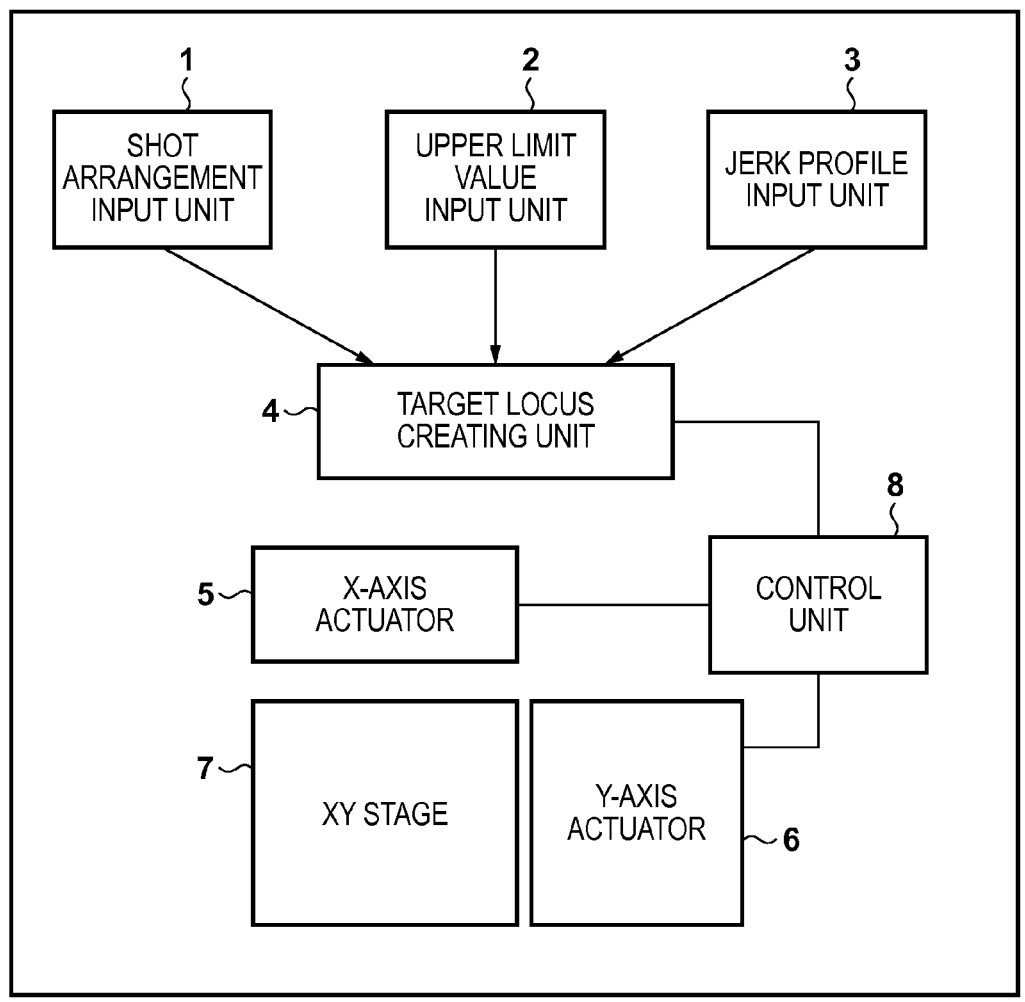
FIG. 1 is a diagram showing a configuration of an exposure apparatus according to a first embodiment.

FIG. 1 is a diagram showing a configuration of an exposure apparatus according to a first embodiment. The exposure apparatus includes an XY stage 7 that holds a target of exposure. An X-axis actuator 5 and a Y-axis actuator 6 are driving units that drive the XY stage 7 in the X axis direction and the Y axis direction, respectively. A shot arrangement input unit 1 receives an input of information regarding the arrangement of exposure shots and the exposure order. An upper limit value input unit 2 receives an input of information regarding an upper limit acceleration value and an upper limit velocity value of the XY stage 7. A jerk profile input unit 3 receives input information regarding a jerk profile. A target locus creating unit 4 creates data that shows how the XY stage 7 is moved along time, or in short a target locus, based on the input information by using constrained-quadratic-linear programming. A control unit 8 controls driving of the X-axis actuator 5 and the Y-axis actuator 6 based on the created target locus. As used herein, "jerk" refers to a motion to cause acceleration to increase or decrease. The jerk profile is information indicating how acceleration is changed during jerk.

Figure 2:
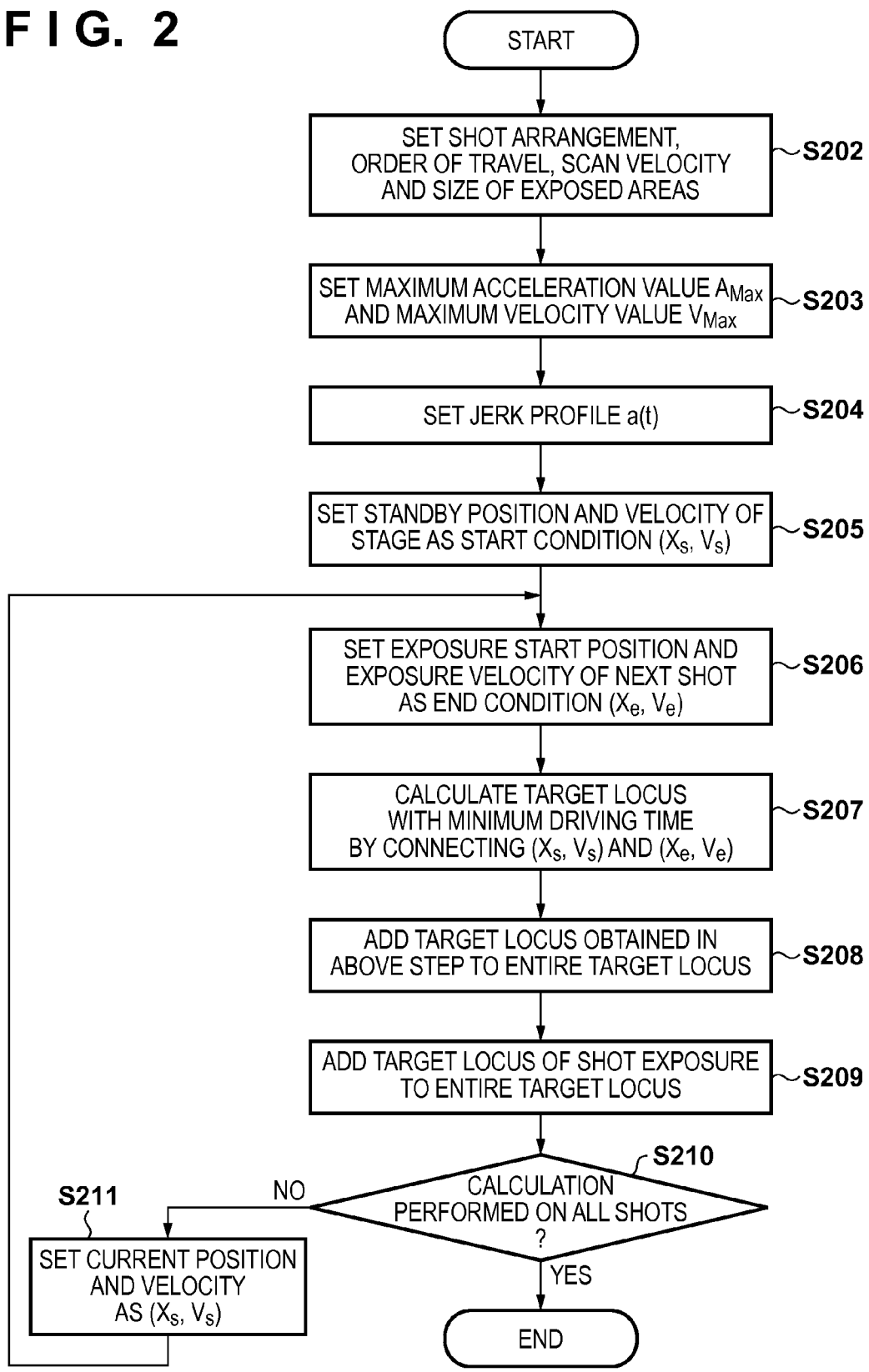
FIG. 2 is a flowchart illustrating target locus creating processing according to the first embodiment.

FIG. 2 is a flowchart illustrating target locus creating processing according to the present embodiment. First, the arrangement of exposure shots, the order of travel, scan velocity, and the size of exposed areas are set via the shot arrangement input unit 1 (S202). Next, a maximum acceleration value $A_{max}$ and a maximum velocity value $V_{Max}$ are set via the upper limit value input unit 2 (S203). Next, a jerk profile a(t) is set via the jerk profile input unit 3 (S204).

The target locus creating unit 4 sets the standby position and standby velocity of the stage as a start condition (start position $x_s$, start velocity $v_s$) (S205). The target locus creating unit 4 further sets the exposure start position and exposure velocity of the next shot as an end condition (end position $x_e$, end velocity $v_e$) (S206). After that, the target locus creating unit 4 calculates a target locus such that the stage driving time from the end of an exposure to the start of the next exposure is within an acceptable value range by connecting $(x_s, v_s)$ and $(x_e, v_e)$ (S207). For example, the target locus creating unit 4 calculates the target locus such that the driving time is minimum. The calculated target locus between shots is added to the entire target locus (S208). Also, the target locus of the shot exposure is added to the entire target locus (S209). Then, the position and velocity at the end of the shot exposure is set as the start condition $(x_s, v_s)$ (S211), and this processing is repeated until calculation has been performed on all of the shots (S210).

Figure 3:
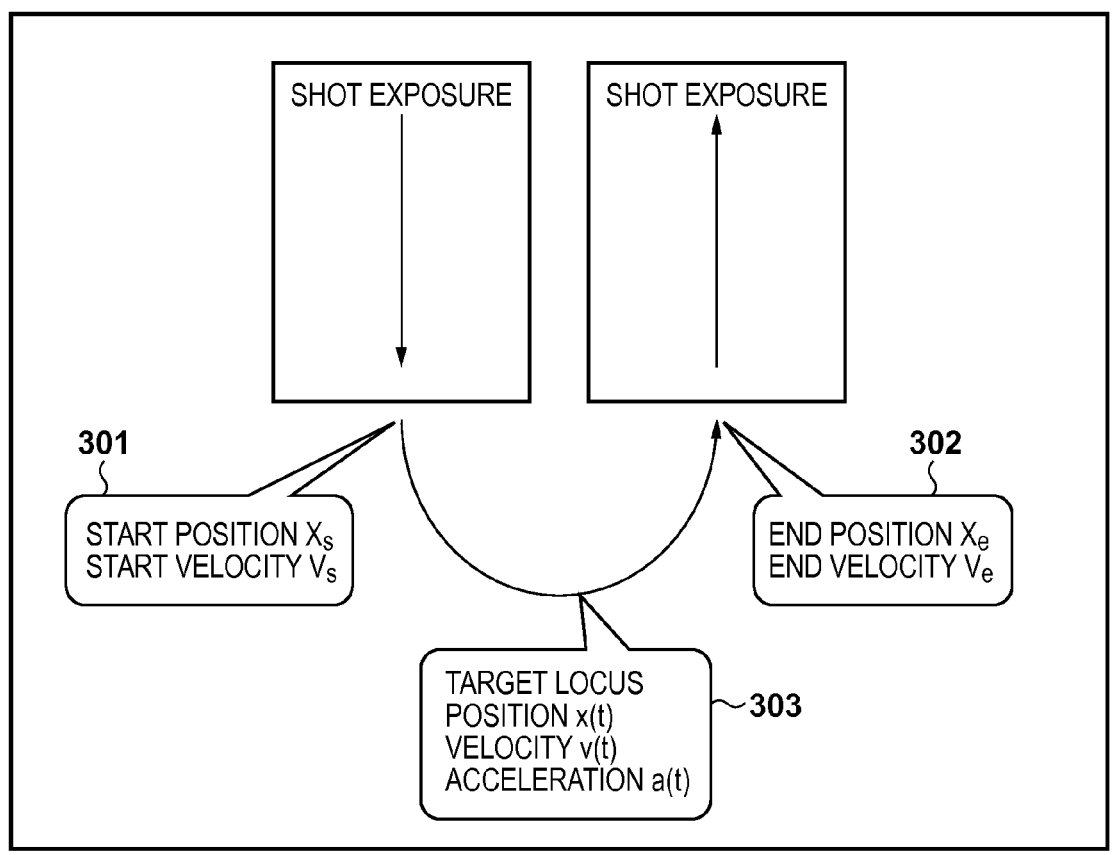
FIG. 3 is a diagram showing an example of a target locus.

Next, a target locus calculation method performed in S207 will be described in detail. FIG. 3 shows an example of a target locus 303 connecting a start condition 301 and an end condition 302. In the first embodiment, a jerk profile is given by the following equation.

$$a(t) = \frac{A}{4}\left(1 \pm \cos\left(\pi \frac{t-s_i}{t_i}\right)\right)^2 \tag{1}$$

Figure 4:
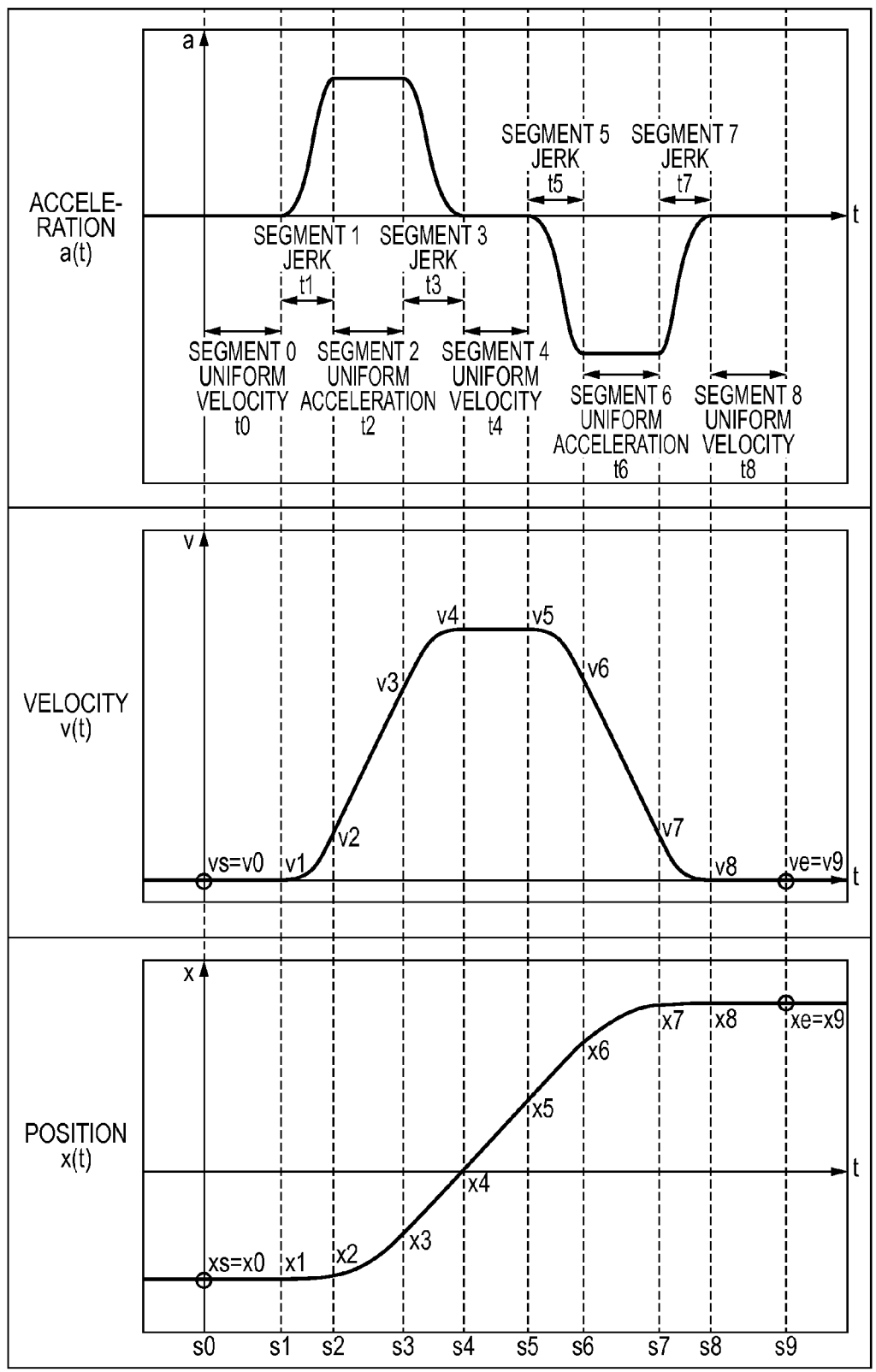
FIG. 4 is a diagram showing a first example of a target locus according to the first embodiment.

FIG. 4 shows an example of a target locus when specific start and end conditions are given. Here, an example is shown in which a target locus between an exposure and the next exposure starts with a uniform motion and ends with a uniform motion. For example, the target locus is divided into nine segments of uniform velocity, jerk, uniform acceleration, jerk, uniform velocity, jerk, uniform acceleration, jerk, and uniform velocity. By dividing into nine segments, it is possible to obtain a feasible target locus even when any start and end conditions are given.

The duration of each segment is represented by $t_0, \ldots, t_8$, and the start time of each segment is represented by $s_0, \ldots, s_8$. Also, the velocity of each segment at the start time is represented by $v_0, \ldots, v_9$, and the position of each segment at the start time is represented by $x_0, \ldots, x_9$.

At this time, the acceleration $a(t)$ can be described by the following mathematical equations per segment.

$$a(t \in \text{Segment } 0) = 0 \tag{2}$$

$$a(t \in \text{Segment } 1) = \frac{A_1}{4}\left(1 - \cos\left(\pi \frac{t-s_1}{t_1}\right)\right)^2 \tag{3}$$

$$= \frac{A_1}{4}\left(\frac{3}{2} - 2\cos\left(\pi \frac{t-s_1}{t_1}\right) + \frac{1}{2}\cos\left(2\pi \frac{t-s_1}{t_1}\right)\right)$$

$$a(t \in \text{Segment } 2) = A_1 \tag{4}$$

$$a(t \in \text{Segment } 3) = \frac{A_1}{4}\left(1 + \cos\left(\pi \frac{t-s_3}{t_3}\right)\right)^2 \tag{5}$$

$$= \frac{A_1}{4}\left(\frac{3}{2} + 2\cos\left(\pi \frac{t-s_3}{t_3}\right) + \frac{1}{2}\cos\left(2\pi \frac{t-s_3}{t_3}\right)\right)$$

$$a(t \in \text{Segment } 4) = 0 \tag{6}$$

$$a(t \in \text{Segment } 5) = \frac{A_2}{4}\left(1 - \cos\left(\pi \frac{t-s_5}{t_5}\right)\right)^2 \tag{7}$$

$$= \frac{A_2}{4}\left(\frac{3}{2} - 2\cos\left(\pi \frac{t-s_5}{t_5}\right) + \frac{1}{2}\cos\left(2\pi \frac{t-s_5}{t_5}\right)\right)$$

-continued $$a(t \in \text{Segment } 6) = A_2 \tag{8}$$

$$a(t \in \text{Segment } 7) = \frac{A_2}{4}\left(1 + \cos\left(\pi \frac{t-s_7}{t_7}\right)\right)^2 \tag{9}$$

$$= \frac{A_2}{4}\left(\frac{3}{2} + 2\cos\left(\pi \frac{t-s_7}{t_7}\right) + \frac{1}{2}\cos\left(2\pi \frac{t-s_7}{t_7}\right)\right)$$

$$a(t \in \text{Segment } 8) = 0 \tag{10}$$

The velocity can be described by the following mathematical equations based on the relationship:

$$v(t) = v_i + \int_{s_i}^{t} a(t)dt. \tag{11}$$

$$v(t \in \text{Segment } 0) = v_0$$

$$v(t \in \text{Segment } 1) = \tag{12}$$

$$v_1 + \frac{A_1}{4}\left(\frac{3}{2}(t-s_1) - 2\left(\frac{t_1}{\pi}\right)\sin\left(\pi \frac{t-s_1}{t_1}\right) + \frac{1}{2}\left(\frac{t_1}{2\pi}\right)\sin\left(2\pi \frac{t-s_1}{t_1}\right)\right)$$

$$v(t \in \text{Segment } 2) = v_2 + A_1(t-s_2) \tag{13}$$

$$v(t \in \text{Segment } 3) = \tag{14}$$

$$v_3 + \frac{A_1}{4}\left(\frac{3}{2}(t-s_3) + 2\left(\frac{t_3}{\pi}\right)\sin\left(\pi \frac{t-s_3}{t_3}\right) + \frac{1}{2}\left(\frac{t_3}{2\pi}\right)\sin\left(2\pi \frac{t-s_3}{t_3}\right)\right)$$

$$v(t \in \text{Segment } 4) = v_4 \tag{15}$$

$$v(t \in \text{Segment } 5) = \tag{16}$$

$$v_5 + \frac{A_2}{4}\left(\frac{3}{2}(t-s_5) - 2\left(\frac{t_5}{\pi}\right)\sin\left(\pi \frac{t-s_5}{t_5}\right) + \frac{1}{2}\left(\frac{t_5}{2\pi}\right)\sin\left(2\pi \frac{t-s_5}{t_5}\right)\right)$$

$$v(t \in \text{Segment } 6) = v_6 + A_2(t-s_6) \tag{17}$$

$$v(t \in \text{Segment } 7) = \tag{18}$$

$$v_7 + \frac{A_2}{4}\left(\frac{3}{2}(t-s_7) + 2\left(\frac{t_7}{\pi}\right)\sin\left(\pi \frac{t-s_7}{t_7}\right) + \frac{1}{2}\left(\frac{t_7}{2\pi}\right)\sin\left(2\pi \frac{t-s_7}{t_7}\right)\right)$$

$$v = (t \in \text{Segment } 8) = v_8 \tag{19}$$

Also, the position can be described by the following mathematical equations based on the relationship:

$$x(t) = x_i + \int_{s_i}^{t} v(t)dt. \tag{20}$$

$$x(t \in \text{Segment } 0) = x_0 + v_0(t-s_0)$$

$$x(t \in \text{Segment } 1) = \tag{21}$$

$$x_1 + v_1(t-s_1) + \frac{A_1}{4}\left(\frac{3}{4}(t-s_1)^2 + 2\left(\frac{t_1}{\pi}\right)^2\cos\left(\pi \frac{t-s_1}{t_1}\right) - 2\left(\frac{t_1}{\pi}\right)^2 - \frac{1}{2}\left(\frac{t_1}{2\pi}\right)^2\cos\left(2\pi \frac{t-s_1}{t_1}\right) + \frac{1}{2}\left(\frac{t_1}{2\pi}\right)^2\right)$$

$$x(t \in \text{Segment } 2) = x_2 + v_2(t-s_2) + \frac{A_1}{2}(t-s_2)^2 \tag{22}$$

$$x(t \in \text{Segment } 3) = \tag{23}$$

$$x_3 + v_3(t-s_3) + \frac{A_1}{4}\left(\frac{3}{4}(t-s_3)^2 - 2\left(\frac{t_3}{\pi}\right)^2\cos\left(\pi \frac{t-s_3}{t_3}\right) + 2\left(\frac{t_3}{\pi}\right)^2 - \frac{1}{2}\left(\frac{t_3}{2\pi}\right)^2\cos\left(2\pi \frac{t-s_3}{t_3}\right) + \frac{1}{2}\left(\frac{t_3}{2\pi}\right)^2\right)$$

$$x(t \in \text{Segment } 4) = x_4 + v_4(t-s_4) \tag{24}$$

$$x(t \in \text{Segment } 5) = \quad (25)$$
$$x_5 + v_5(t-s_5) + \frac{A_2}{4}\left(\frac{3}{4}(t-s_5)^2 + 2\left(\frac{t_5}{\pi}\right)^2 \cos\left(\pi\frac{t-s_5}{t_5}\right) - 2\left(\frac{t_5}{\pi}\right)^2 - \frac{1}{2}\left(\frac{t_5}{2\pi}\right)^2 \cos\left(2\pi\frac{t-s_5}{t_5}\right) + \frac{1}{2}\left(\frac{t_5}{2\pi}\right)^2\right)$$

$$x(t \in \text{Segment } 6) = x_6 + v_6(t-s_6) + \frac{A_2}{2}(t-s_6)^2 \quad (26)$$

$$x(t \in \text{Segment } 7) = \quad (27)$$
$$x_7 + v_7(t-s_7) + \frac{A_2}{4}\left(\frac{3}{4}(t-s_7)^2 - 2\left(\frac{t_7}{\pi}\right)^2 \cos\left(\pi\frac{t-s_7}{t_7}\right) + 2\left(\frac{t_7}{\pi}\right)^2 - \frac{1}{2}\left(\frac{t_7}{2\pi}\right)^2 \cos\left(2\pi\frac{t-s_7}{t_7}\right) + \frac{1}{2}\left(\frac{t_7}{2\pi}\right)^2\right)$$

$$x(t \in \text{Segment } 8) = x_8 + v_8(t-s_8) \quad (28)$$

The following relational equations can be obtained by substituting the end time of each segment $t=s_i+t_i$ into Equations 11 to 28 and eliminating $s_i$.

$$v_0 = v_s \quad (29)$$
$$v_1 = v_0 \quad (30)$$
$$v_2 = v_1 + \frac{3}{8}A_1 t_1 \quad (31)$$
$$v_3 = v_2 + A_1 t_2 \quad (32)$$
$$v_4 = v_3 + \frac{3}{8}A_1 t_3 \quad (33)$$
$$v_5 = v_4 \quad (34)$$
$$v_6 = v_5 + \frac{3}{8}A_2 t_5 \quad (35)$$
$$v_7 = v_6 + A_2 t_6 \quad (36)$$
$$v_8 = v_7 + \frac{3}{8}A_2 t_7 \quad (37)$$
$$v_9 = v_8 \quad (38)$$
$$v_e = v_9 \quad (39)$$
$$x_0 = x_s \quad (40)$$
$$x_1 = x_0 + v_0 t_0 \quad (41)$$
$$x_2 = x_1 + v_1 t_1 + \frac{A_1}{4}\left(\frac{3}{4}t_1^2 - 4\left(\frac{t_1}{\pi}\right)^2\right) \quad (42)$$
$$x_3 = x_2 + v_2 t_2 + \frac{A_1}{2}t_2^2 \quad (43)$$
$$x_4 = x_3 + v_3 t_3 + \frac{A_1}{4}\left(\frac{3}{4}t_3^2 + 4\left(\frac{t_3}{\pi}\right)^2\right) \quad (44)$$
$$x_5 = x_4 + v_4 t_4 \quad (45)$$
$$x_6 = x_5 + v_5 t_5 + \frac{A_2}{4}\left(\frac{3}{4}t_5^2 - 4\left(\frac{t_5}{\pi}\right)^2\right) \quad (46)$$
$$x_7 = x_6 + v_6 t_6 + \frac{A_2}{2}t_6^2 \quad (47)$$
$$x_8 = x_7 + v_7 t_7 + \frac{A_2}{4}\left(\frac{3}{4}t_7^2 + 4\left(\frac{t_7}{\pi}\right)^2\right) \quad (48)$$
$$x_9 = x_8 + v_8 t_8 \quad (49)$$
$$x_e = x_9 \quad (50)$$

It is also necessary to satisfy the following conditions.

$$t_i \geq 0 \ (i=0,\ldots,8) \quad (51)$$
$$|v_i| \leq v_{Max} \ (i=0,\ldots,9) \quad (52)$$
$$|A_i| \leq A_{Max} \ (i=1,2) \quad (53)$$

Furthermore, the jerk time has a lower limit $t_j$.

$$t_i \geq t_j \ (i=1,3,5,7) \quad (54)$$

The problem of obtaining a target locus with a minimum driving time can be formulated as a constrained-quadratic-linear programming problem that minimizes the following driving time as a target function by using Equations 29 to 54 as constraint conditions, and solved.

$$t_0+t_1+t_2+t_3+t_4+t_5+t_6+t_7+t_8 \quad (55)$$

The constraint conditions in the constrained-quadratic-linear programming described above can be summarized as follows:

(1) the target locus simultaneously satisfies the position and the velocity of the stage at the end of an exposure;

(2) the target locus simultaneously satisfies the position and the velocity of the stage at the start of the next exposure;

(3) the velocity of the stage does not exceed the input upper limit velocity value;

(4) the acceleration of the stage does not exceed the input upper limit acceleration value; and (5) the time required for jerk does not fall below a lower limit value.

Figure 5:
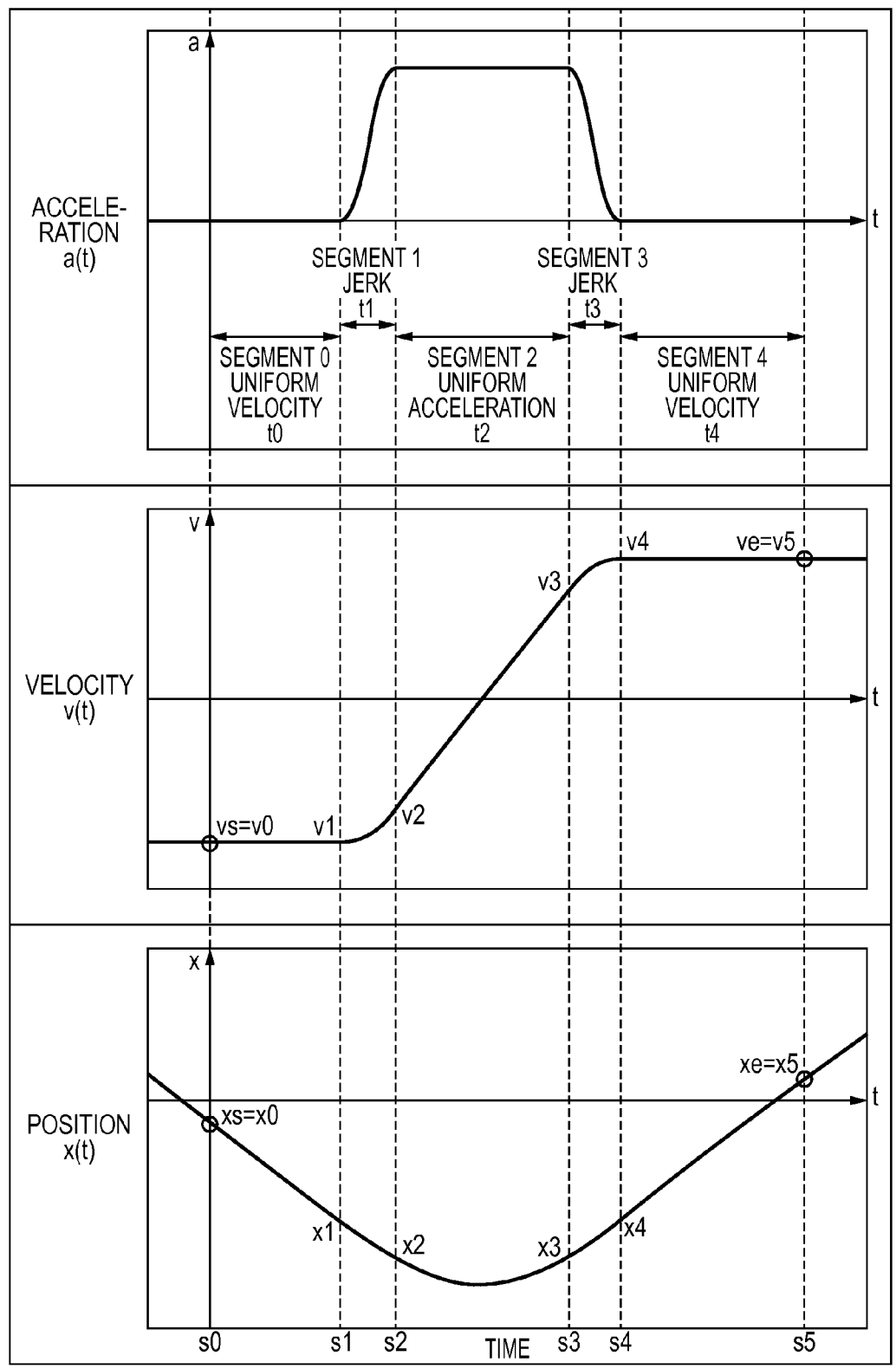
FIG. 5 is a diagram showing a second example of a target locus according to the first embodiment.

FIG. 5 shows an example of a target locus when other start and end conditions are given. The target locus is divided into five segments of uniform velocity, jerk, uniform acceleration, jerk, and uniform velocity. The target locus that has been divided into five segments as described above may not be feasible depending on the start and end conditions. In the case of five segments as well, the following equations are established in the same manner as in the case of nine segments described above. The acceleration a(t) can be described by the following mathematical equations per segment.

$$a(t \in \text{Segment } 0) = 0 \quad (56)$$

$$a(t \in \text{Segment } 1) = \quad (57)$$
$$\frac{A_1}{4}\left(1 - \cos\left(\pi\frac{t-s_1}{t_1}\right)\right)^2 = \frac{A_1}{4}\left(\frac{3}{2} - 2\cos\left(\pi\frac{t-s_1}{t_1}\right) + \frac{1}{2}\cos\left(2\pi\frac{t-s_1}{t_1}\right)\right)$$

$$a(t \in \text{Segment } 2) = A_1 \quad (58)$$

$$a(t \in \text{Segment } 3) = \quad (59)$$
$$\frac{A_1}{4}\left(1 + \cos\left(\pi\frac{t-s_3}{t_3}\right)\right)^2 = \frac{A_1}{4}\left(\frac{3}{2} + 2\cos\left(\pi\frac{t-s_3}{t_3}\right) + \frac{1}{2}\cos\left(2\pi\frac{t-s_3}{t_3}\right)\right)$$

$$a(t \in \text{Segment } 4) = 0 \quad (60)$$

The velocity can be described by the following mathematical equations based on the relationship:

$$v(t) = v_i + \int_{s_i}^{t} a(t)\,dt.$$ (61)

$$v(t \in \text{Segment0}) = v_0$$

$$v(t \in \text{Segment1}) = v_1 + \frac{A_1}{4}\left(\frac{3}{2}(t-s_1) - 2\left(\frac{t_1}{\pi}\right)\sin\left(\pi\frac{t-s_1}{t_1}\right) + \frac{1}{2}\left(\frac{t_1}{2\pi}\right)\sin\left(2\pi\frac{t-s_1}{t_1}\right)\right)$$ (62)

$$v(t \in \text{Segment2}) = v_2 + A_1(t - s_2)$$ (63)

$$v(t \in \text{Segment3}) = v_3 + \frac{A_2}{4}\left(\frac{3}{2}(t-s_3) + 2\left(\frac{t_3}{\pi}\right)\sin\left(\pi\frac{t-s_3}{t_3}\right) + \frac{1}{2}\left(\frac{t_3}{2\pi}\right)\sin\left(2\pi\frac{t-s_3}{t_3}\right)\right)$$ (64)

$$v(t \in \text{Segment4}) = v_4$$ (65)

Also, the position can be described by the following mathematical equations based on the relationship:

$$x(t) = x_i + \int_{s_i}^{t} v(t)\,dt.$$ (66)

$$x(t \in \text{Segment0}) = x_0 + v_0(t - s_0)$$

$$x(t \in \text{Segment1}) = x_1 + v_1(t-s_1) + \frac{A_1}{4}\left(\frac{3}{4}(t-s_1)^2 + 2\left(\frac{t_1}{\pi}\right)^2\cos\left(\pi\frac{t-s_1}{t_1}\right) - 2\left(\frac{t_1}{\pi}\right)^2 - \frac{1}{2}\left(\frac{t_1}{2\pi}\right)^2\cos\left(2\pi\frac{t-s_1}{t_1}\right) + \frac{1}{2}\left(\frac{t_1}{2\pi}\right)^2\right)$$ (67)

$$x(t \in \text{Segment2}) = x_2 + v_2(t - s_2) + \frac{A_1}{2}(t - s_2)^2$$ (68)

$$x(t \in \text{Segment3}) = x_3 + v_3(t-s_3) + \frac{A_1}{4}\left(\frac{3}{4}(t-s_3)^2 + 2\left(\frac{t_3}{\pi}\right)^2\cos\left(\pi\frac{t-s_3}{t_3}\right) + 2\left(\frac{t_3}{\pi}\right)^2 - \frac{1}{2}\left(\frac{t_3}{2\pi}\right)^2\cos\left(2\pi\frac{t-s_3}{t_3}\right) + \frac{1}{2}\left(\frac{t_3}{2\pi}\right)^2\right)$$ (69)

$$x(t \in \text{Segment4}) = x_4 + v_4(t - s_4)$$ (70)

The following relational equations can be obtained by substituting the end time of each segment $t = s_i + t_i$ into Equations 61 to 70 and eliminating $s_i$.

$$v_0 = v_s$$ (71)

$$v_1 = v_0$$ (72)

$$v_2 = v_1 + \frac{3}{8}A_1 t_1$$ (73)

$$v_3 = v_2 + A_1 t_2$$ (74)

$$v_4 = v_3 + \frac{3}{8}A_1 t_3$$ (75)

$$v_5 = v_4$$ (76)

$$v_e = v_5$$ (77)

$$x_0 = x_s$$ (78)

$$x_1 = x_0 + v_0 t_0$$ (79)

$$x_2 = x_1 + v_1 t_1 + \frac{A_1}{4}\left(\frac{3}{4}t_1^2 - 4\left(\frac{t_1}{\pi}\right)^2\right)$$ (80)

$$x_3 = x_2 + v_2 t_2 + \frac{A_1}{2}t_2^2$$ (81)

$$x_4 = x_3 + v_3 t_3 + \frac{A_1}{4}\left(\frac{3}{4}t_3^2 + 4\left(\frac{t_3}{\pi}\right)^2\right)$$ (82)

$$x_5 = x_4 + v_4 t_4$$ (83)

$$x_e = x_5$$ (84)

It is also necessary to satisfy the following conditions.

$$t_i \geq 0 \ (i=0,\ldots,4)$$ (85)

$$|v_i| \leq v_{Max} \ (i=0,\ldots,5)$$ (86)

$$|A_1| \leq A_{Max}$$ (87)

Furthermore, the jerk time has a lower limit $t_j$.

$$t_i \geq t_j \ (i=1,3)$$ (88)

The problem of obtaining a target locus with a minimum driving time can be formulated as a constrained-quadratic-linear programming problem that minimizes the following driving time as a target function by using Equations 71 to 88 as constraint conditions, and solved.

$$t_0 + t_1 + t_2 + t_3 + t_4$$ (89)

Figure 6:
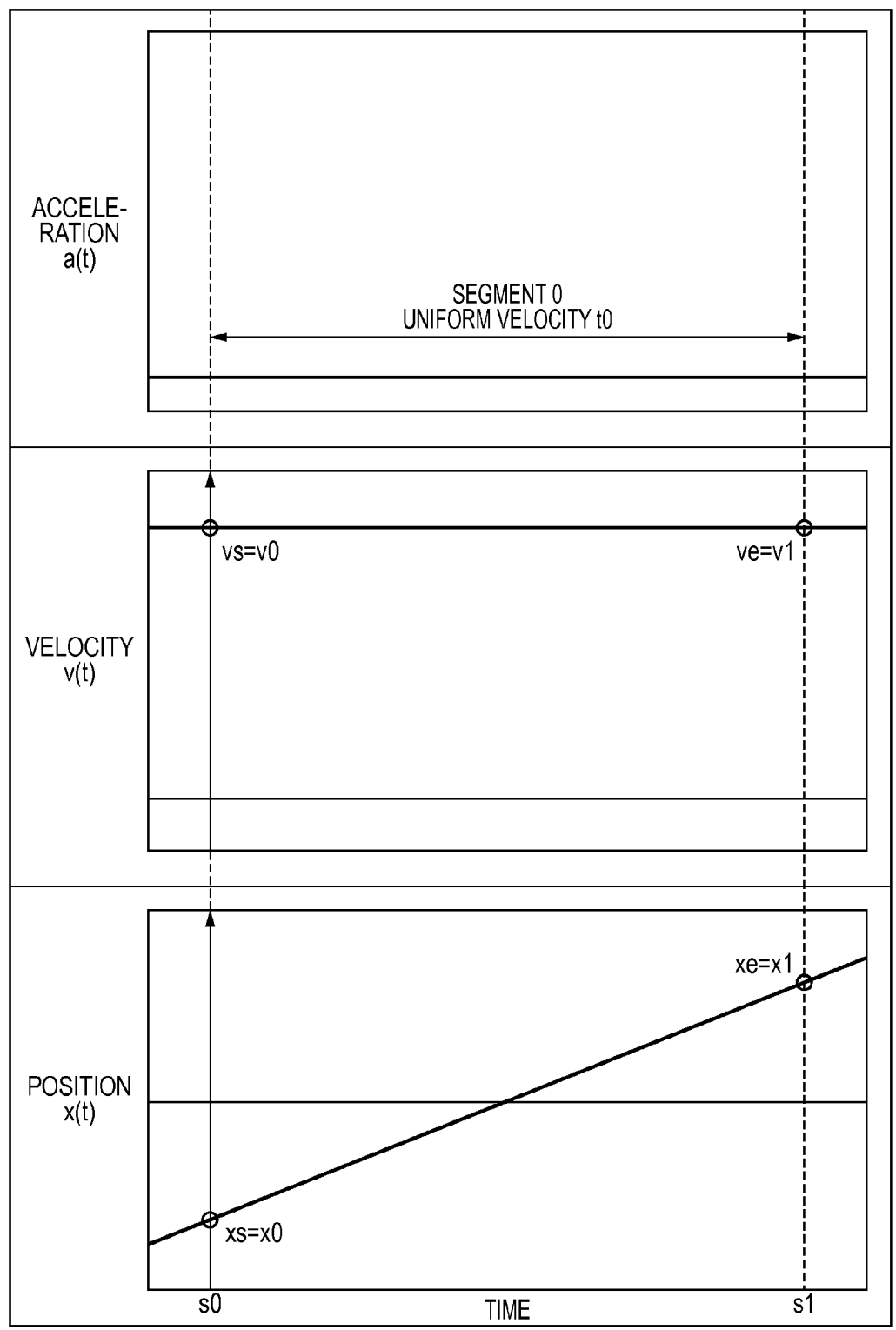
FIG. 6 is a diagram showing a third example of a target locus according to the first embodiment.

FIG. 6 shows an example of a target locus when other start and end conditions are given. The target locus has only one segment of uniform velocity. Such a target locus may not be feasible depending on the start and end conditions. In this case as well, the following equations are established in the same manner as in the case of nine segments and in the case of five segments described above. The acceleration a(t) can be described by the following mathematical equation per segment.

$$a(t \in \text{Segment 0}) = 0$$ (90)

The velocity can be described by the following mathematical equation based on the relationship:

$$v(t) = v_i + \int_{s_i}^{t} a(t)\,dt.$$

$$v(t \in \text{Segment 0}) = v_0$$ (91)

Also, the position can be described by the following mathematical equation based on the relationship:

$$x(t) = x_i + \int_{s_i}^{t} v(t)\,dt.$$

$$x(t \in \text{Segment 0}) = x_0 v_0(t - s_0)$$ (92)

The following relational equations can be obtained by substituting the end time of each segment $t = s_0 + t_0$ into Equations 91 and 92 and eliminating $s_0$.

$$v_0 = v_s$$ (93)

$$v_1 = v_0$$ (94)

$$v_e = v_1$$ (95)

$$x_0 = x_s$$ (96)

$$x_1 = x_0 + v_0 t_0$$ (97)

$$x_e = x_1$$ (98)

It is also necessary to satisfy the following conditions.

$$t_0 \geq 0 \tag{99}$$

$$|v_i| \leq v_{Max} \ (i=0,1) \tag{100}$$

The problem of obtaining a target locus with a minimum driving time can be formulated as a linear programming problem that minimizes the following driving time $t_0$ as a target function by using Equations 93 to 100 as constraint conditions, and solved.

In this case, it is very simple, and thus the solution can be written.

$$t_0 = \frac{x_e - x_s}{v_s} \tag{102}$$

As described above, the solution may not be feasible depending on the start and end conditions. For example, if $t_0$ in Equation 102 takes a negative value, the solution is not feasible.

Among the three target loci in the case of nine segments, the case of five segments and the case of one segment, the target locus that is feasible and has a minimum driving time is the target locus that needs to be obtained.

Second Embodiment

In a second embodiment, another jerk profile is given by the following equation.

$$a(t) = A\left(\frac{t-s_i}{t_i}\right), \tag{103}$$

or $$a(t) = A\left(1 - \frac{t-s_i}{t_i}\right)$$

Figure 7:
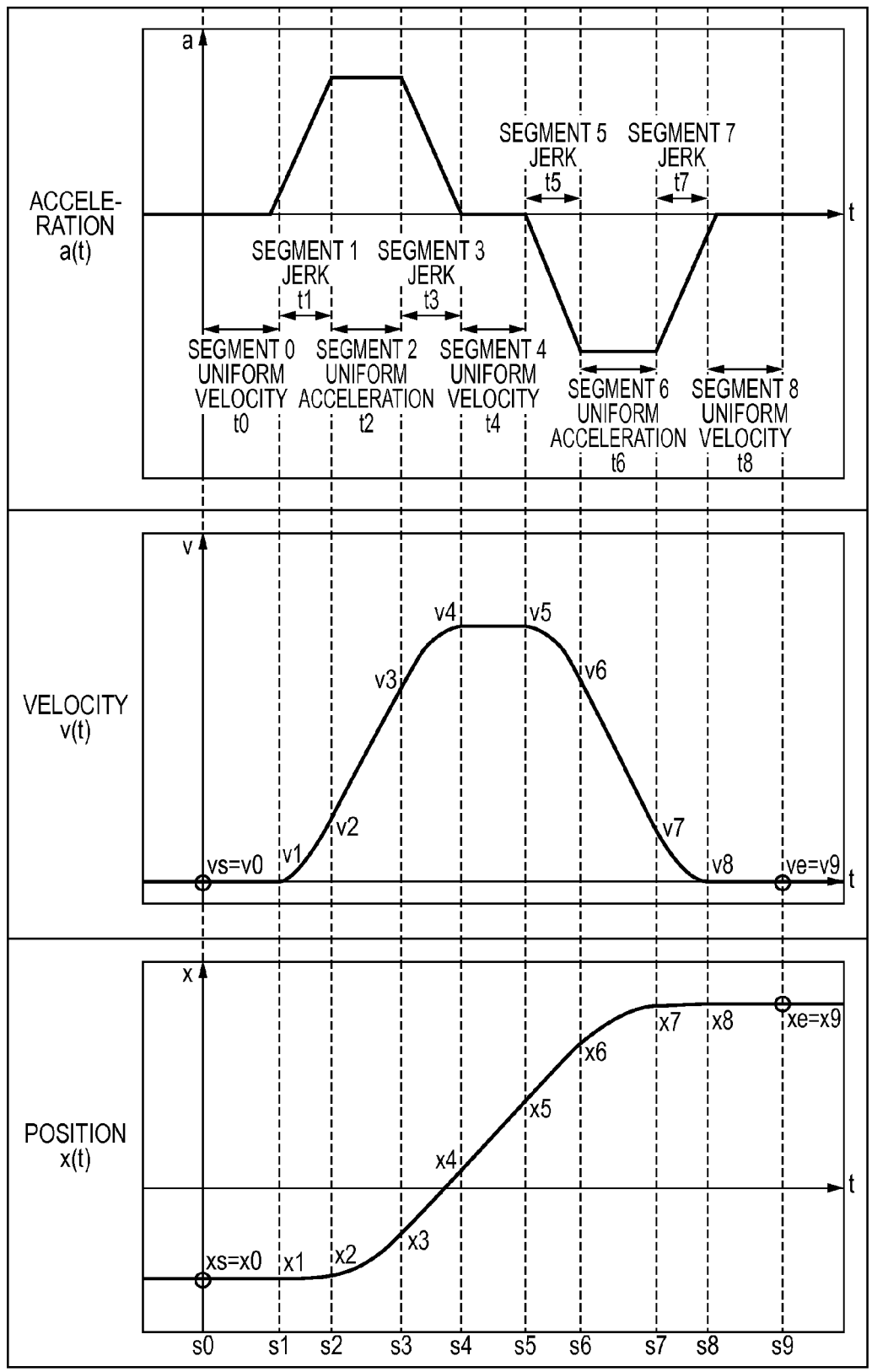
FIG. 7 is a diagram showing a first example of a target locus according to a second embodiment.

FIG. 7 shows an example of a target locus when specific start and end conditions are given. The target locus is divided into nine segments of uniform velocity, jerk, uniform acceleration, jerk, uniform velocity, jerk, uniform acceleration, jerk, and uniform velocity. At this time, the acceleration a(t) can be described by the following mathematical equations per segment.

$$a(t \in \text{Segment 0}) = 0 \tag{104}$$

$$a(t \in \text{Segment 1}) = A_1\left(\frac{t-s_1}{t_1}\right) \tag{105}$$

$$a(t \in \text{Segment 2}) = A_1 \tag{106}$$

$$a(t \in \text{Segment 3}) = A_1\left(1 - \frac{t-s_3}{t_3}\right) \tag{107}$$

$$a(t \in \text{Segment 4}) = 0 \tag{108}$$

$$a(t \in \text{Segment 5}) = A_2\left(\frac{t-s_5}{t_5}\right) \tag{109}$$

$$a(t \in \text{Segment 6}) = A_2 \tag{110}$$

$$a(t \in \text{Segment 7}) = A_2\left(1 - \frac{t-s_3}{t_3}\right) \tag{111}$$

$$a(t \in \text{Segment 8}) = 0 \tag{112}$$

The velocity can be described by the following mathematical equations based on the relationship:

$$v(t) = v_i + \int_{s_i}^{t} a(t) dt. \tag{113}$$

$$v(t \in \text{Segment 0}) = v_0$$

$$v(t \in \text{Segment 1}) = v_1 + A_1\left(\frac{(t-s_1)^2}{2t_1}\right) \tag{114}$$

$$v(t \in \text{Segment 2}) = v_2 + A_1(t-s_2) \tag{115}$$

$$v(t \in \text{Segment 3}) = v_3 + A_1\left((t-s_3) - \frac{(t-s_3)^2}{2t_3}\right) \tag{116}$$

$$v(t \in \text{Segment 4}) = v_4 \tag{117}$$

$$v(t \in \text{Segment 5}) = v_5 + A_2\left(\frac{(t-s_5)^2}{2t_5}\right) \tag{118}$$

$$v(t \in \text{Segment 6}) = v_6 + A_2(t-s_6) \tag{119}$$

$$v(t \in \text{Segment 7}) = v_7 + A_2\left((t-s_7) - \frac{(t-s_7)^2}{2t_7}\right) \tag{120}$$

$$v(t \in \text{Segment 8}) = v_8 \tag{121}$$

Also, the position can be described by the following mathematical equations based on the relationship:

$$x(t) = x_i + \int_{s_i}^{t} v(t) dt. \tag{122}$$

$$x(t \in \text{Segment 0}) = x_0 + v_0(t-s_0)$$

$$x(t \in \text{Segment 1}) = x_1 + v_1(t-s_1) + A_1\left(\frac{(t-s_1)^3}{6t_1}\right) \tag{123}$$

$$x(t \in \text{Segment 2}) = x_2 + v_2(t-s_2) + \frac{A_1}{2}(t-s_2)^2 \tag{124}$$

$$x(t \in \text{Segment 3}) = x_3 + v_3(t-s_3) + A_1\left(\frac{(t-s_3)^2}{2} - \frac{(t-s_3)^3}{6t_3}\right) \tag{125}$$

$$x(t \in \text{Segment 4}) = x_4 + v_4(t-s_4) \tag{126}$$

$$x(t \in \text{Segment 5}) = x_5 + v_5(t-s_5) + A_2\left(\frac{(t-s_5)^3}{6t_5}\right) \tag{127}$$

$$x(t \in \text{Segment 6}) = x_6 + v_6(t-s_6) + \frac{A_2}{2}(t-s_6)^2 \tag{128}$$

$$x(t \in \text{Segment 7}) = x_7 + v_7(t-s_7) + A_2\left(\frac{(t-s_7)^2}{2} - \frac{(t-s_7)^3}{6t_7}\right) \tag{129}$$

$$x(t \in \text{Segment 8}) = x_8 + v_8(t-s_8) \tag{130}$$

The following relational equations can be obtained by substituting the end time of each segment $t = s_i + t_i$ into Equations 113 to 130 and eliminating $s_i$.

$$v_0 = v_s \tag{131}$$

$$v_1 = v_0 \tag{132}$$

$$v_2 = v_1 + A_1 \frac{t_1}{2} \tag{133}$$

$$v_3 = v_2 + A_1 t_2 \tag{134}$$

-continued $$v_4 = v_3 + A_1\left(t_3 - \frac{t_3}{2}\right) \quad (135)$$

$$v_5 = v_4 \quad (136)$$

$$v_6 = v_5 + A_2 \frac{t_5}{2} \quad (137)$$

$$v_7 = v_6 + A_2 t_6 \quad (138)$$

$$v_8 = v_7 + A_2\left(t_7 - \frac{t_7}{2}\right) \quad (139)$$

$$v_9 = v_8 \quad (140)$$

$$v_e = v_9 \quad (141)$$

$$x_0 = x_s \quad (142)$$

$$x_1 = x_0 + v_0 t_0 \quad (143)$$

$$x_2 = x_1 + v_1 t_1 + A_1 \frac{t_1^2}{6} \quad (144)$$

$$x_3 = x_2 + v_2 t_2 + \frac{A_1}{2} t_2^2 \quad (145)$$

$$x_4 = x_3 + v_3 t_3 + A_1\left(\frac{t_3^2}{2} - \frac{t_3^2}{6}\right) \quad (146)$$

$$x_5 = x_4 + v_4 t_4 \quad (147)$$

$$x_6 = x_5 + v_5 t_5 + A_2 \frac{t_5^2}{6} \quad (148)$$

$$x_7 = x_6 + v_6 t_6 + \frac{A_2}{2} t_6^2 \quad (149)$$

$$x_8 = x_7 + v_7 t_7 + A_2\left(\frac{t_7^2}{2} - \frac{t_7^2}{6}\right) \quad (150)$$

$$x_9 = x_8 + v_8 t_8 \quad (151)$$

$$x_e = x_9 \quad (152)$$

It is also necessary to satisfy the following conditions.

$$t_i \leq 0 \ (i=0,\ldots,8) \quad (153)$$

$$|v_i| \leq v_{Max} \ (i=0,\ldots,9) \quad (154)$$

$$|A_i| \leq A_{Max} \ (i=1,2) \quad (155)$$

Furthermore, the jerk time has a lower limit $t_j$.

$$t_i \leq t_j \ (i=1,3,5,7) \quad (156)$$

The problem of obtaining a target locus with a minimum driving time can be formulated as a constrained-quadratic-linear programming problem that minimizes the following driving time as a target function by using Equations 131 to 156 as constraint conditions, and solved.

$$t_0+t_1+t_2+t_3+t_4+t_5+t_6+t_7+t_8 \quad (157)$$

Figure 8:
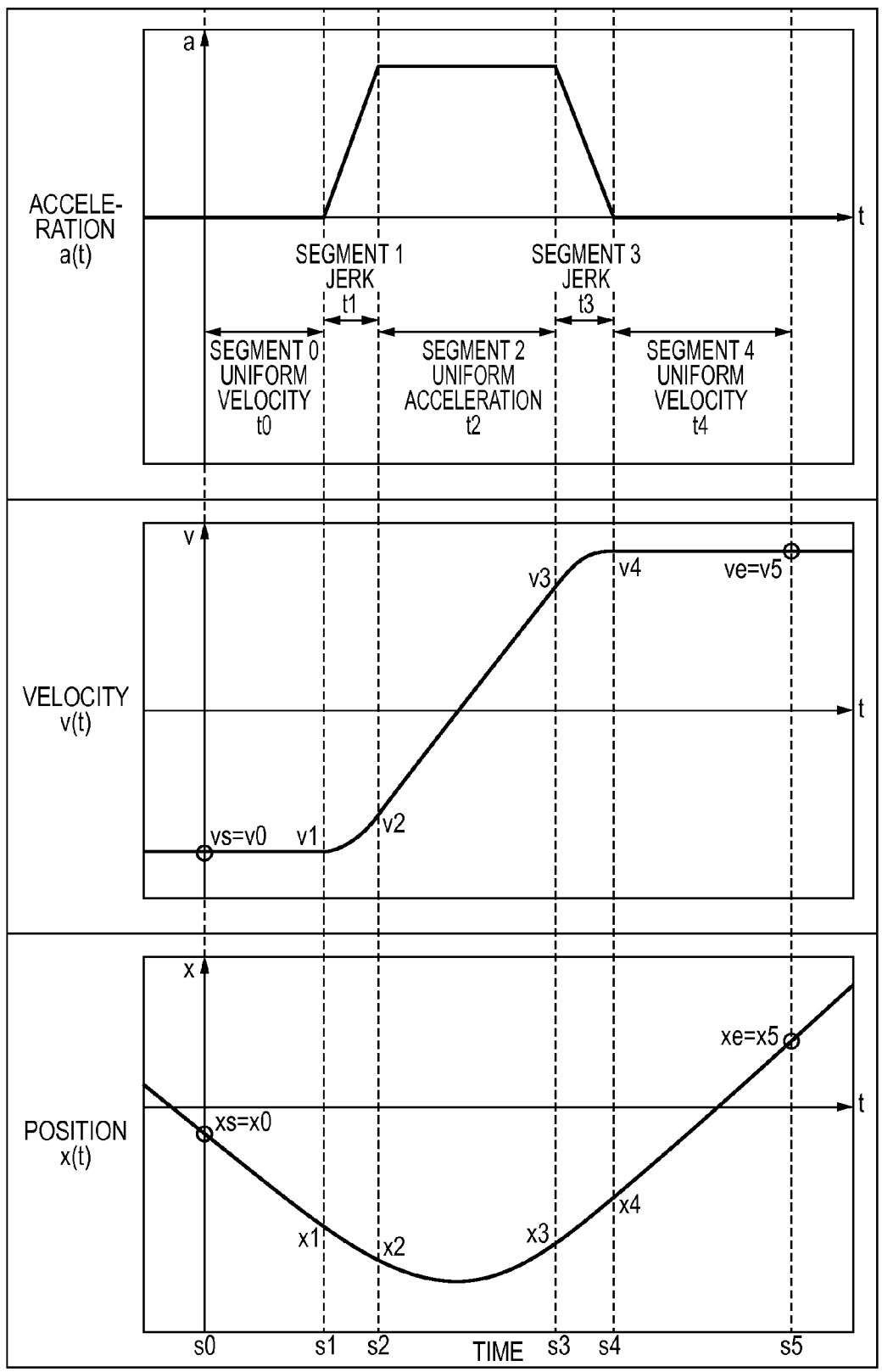
FIG. 8 is a diagram showing a second example of a target locus according to the second embodiment.

FIG. 8 shows an example of a target locus when other start and end conditions are given. The target locus is divided into five segments of uniform velocity, jerk, uniform acceleration, jerk, and uniform velocity. The target locus that has been divided into five segments as described above may not be feasible depending on the start and end conditions. In the case of five segments as well, the following equations are established in the same manner as in the case of nine segments described above.

The acceleration a(t) can be described by the following mathematical equations per segment.

$$a(t \in \text{Segment } 0) = 0 \quad (157)$$

$$a(t \in \text{Segment } 1) = A_1\left(\frac{t-s_1}{t_1}\right) \quad (158)$$

$$a(t \in \text{Segment } 2) = A_1 \quad (159)$$

$$a(t \in \text{Segment } 3) = A_1\left(1 - \frac{t-s_3}{t_3}\right) \quad (160)$$

$$a(t \in \text{Segment } 4) = 0 \quad (161)$$

The velocity can be described by the following mathematical equations based on the relationship:

$$v(t) = v_i + \int_{s_i}^{t} a(t)dt. \quad (162)$$

$$v(t \in \text{Segment } 0) = v_0$$

$$v(t \in \text{Segment } 1) = v_1 + A_1\left(\frac{(t-s_1)^2}{2t_1}\right) \quad (163)$$

$$v(t \in \text{Segment } 2) = v_2 + A_1(t-s_2) \quad (164)$$

$$v(t \in \text{Segment } 3) = v_3 + A_1\left((t-s_3) - \frac{(t-s_3)^2}{2t_3}\right) \quad (165)$$

$$v(t \in \text{Segment } 4) = v_4 \quad (166)$$

Also, the position can be described by the following mathematical equations based on the relationship:

$$x(t) = x_i + \int_{s_i}^{t} v(t)dt. \quad (167)$$

$$x(t \in \text{Segment } 0) = x_0 + v_0(t-s_0)$$

$$x(t \in \text{Segment } 1) = x_1 + v_1(t-s_1) + A_1\left(\frac{(t-s_1)^3}{6t_1}\right) \quad (168)$$

$$x(t \in \text{Segment } 2) = x_2 + v_2(t-s_2) + \frac{A_1}{2}(t-s_2)^2 \quad (169)$$

$$x(t \in \text{Segment } 3) = x_3 + v_3(t-s_3) + A_1\left(\frac{(t-s_3)^2}{2} - \frac{(t-s_3)^3}{6t_3}\right) \quad (170)$$

$$x(t \in \text{Segment } 4) = x_4 + v_4(t-s_4) \quad (171)$$

The following relational equations can be obtained by substituting the end time of each segment $t=s_i+t_i$ into Equations 162 to 171 and eliminating $s_i$.

$$v_0 = v_s \quad (172)$$

$$v_1 = v_0 \quad (173)$$

$$v_2 = v_1 + A_1 \frac{t_1}{2} \quad (174)$$

$$v_3 = v_2 + A_1 t_2 \quad (175)$$

$$v_4 = v_3 + A_1\left(t_3 - \frac{t_3}{2}\right) \quad (176)$$

-continued $$v_5 = v_4 \quad (177)$$

$$v_e = v_5 \quad (178)$$

$$x_0 = x_s \quad (179)$$

$$x_1 = x_0 + v_0 t_0 \quad (180)$$

$$x_2 = x_1 + v_1 t_1 + A_1 \frac{t_1^2}{6} \quad (181)$$

$$x_3 = x_2 + v_2 t_2 + \frac{A_1}{2} t_2^2 \quad (182)$$

$$x_4 = x_3 + v_3 t_3 + A_1 \left(\frac{t_3^2}{2} - \frac{t_3^2}{6}\right) \quad (183)$$

$$x_5 = x_4 + v_4 t_4 \quad (184)$$

$$x_e = x_5 \quad (185)$$

It is also necessary to satisfy the following conditions.

$$t_i \geq 0 \ (i=0,\ldots,4) \quad (186)$$

$$|v_i| \leq v_{Max} \ (i=0,\ldots,5) \quad (187)$$

$$|A_1| \leq A_{Max} \quad (188)$$

Furthermore, the jerk time has a lower limit $t_j$.

$$t_i \leq t_j \ (i=1,3) \quad (189)$$

The problem of obtaining a target locus with a minimum driving time can be formulated as a constrained-quadratic-linear programming problem that minimizes the following driving time as a target function by using Equations 172 to 189 as constraint conditions, and solved.

$$t_0+t_1+t_2+t_3+t_4 \quad (190)$$

Next, calculation is performed so as to determine whether the target locus can be implemented by using only one segment of uniform velocity, but this is exactly the same as in the case of one segment described in Example 1 above, and thus a description thereof is omitted here. Among the three target loci in the case of nine segments, the case of five segments and the case of one segment, the target locus that is feasible and has a minimum driving time is the target locus that needs to be obtained.

Third Embodiment

FIG. 9 is a diagram showing the arrangement of exposure shots, a start condition and an end condition according to a third embodiment. Here, the exposure shot is transitioned in the order of a→b→c by repeating a static exposure and step driving. Such an exposure apparatus is generally called a "stepper". In this case, the target locus between an exposure and the next exposure starts with a static motion and ends with a static motion. The target locus of the stepper can be optimized by inputting a special condition that the scan velocity and the size of exposed areas are set to zero into the first embodiment.

Other Embodiments

In the exposure apparatus described above, the processing of the control unit, the target locus creating unit, the shot arrangement input unit, the upper limit value input unit and the jerk profile input unit may be executed by a processor. The exposure apparatus may be configured to include one or a plurality of control substrates on which a processor and a memory having a program stored therein are mounted.

In addition, input by the shot arrangement input unit, the upper limit value input unit and the jerk profile input unit may be performed by using an input apparatus such as a keyboard, or a wireless or wired communication apparatus.

Embodiment of Method of Manufacturing Article

A method of manufacturing an article according to an embodiment of the present invention is suitable to manufacture, for example, an article such as a micro device such as a semiconductor device or an element having a micro-structure. The method of manufacturing an article of the present embodiment includes a step of forming a latent image pattern on a photosensitizing agent applied onto a substrate by using the above-described exposure apparatus (step of exposing a substrate with light) and a step of developing the substrate on which the latent image pattern has been formed in the above step. The manufacturing method further includes other known steps (oxidation, film-forming, vapor deposition, doping, planarization, etching, photoresist stripping, dicing, bonding, packaging, and the like). The method of manufacturing an article according to the present embodiment is advantageous in terms of at least one of the performance, quality, productivity and production cost of the article as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-099827, filed May 13, 2014, which is hereby incorporated by reference herein in its entirety.

What is claimed is:

1. An exposure apparatus that exposes a plurality of exposure shots on a substrate, the apparatus comprising:
    a stage configured to hold the substrate;
    a driving unit configured to drive the stage;
    a processor configured to create a target locus of the stage; and
    a control unit configured to control the driving unit based on the created target locus created by the processor,
    wherein the processor creates the target locus using constrained-quadratic-linear programming for deriving a driving time of the stage so that the driving time from an end of an exposure of a first exposure shot to a start of a next exposure of a second exposure shot as a target function falls within an acceptable range, and
    wherein the constrained-quadratic-linear programming is executed under constrained conditions of an arrangement of the exposure shots, an exposure order of the exposure shots, an upper limit of a velocity of the stage, an upper limit of an acceleration of the stage, and a lower limit of a time required for jerk of the stage.

2. The exposure apparatus according to claim 1, wherein the processor is configured to create the target locus of the stage further based on an input jerk profile that includes information indicating how acceleration changes during jerk.

3. The exposure apparatus according to claim 2, wherein the constraint conditions include:
    (1) the target locus simultaneously satisfies a position and a velocity of the stage at the end of the exposure to the first exposure shot;
    (2) the target locus simultaneously satisfies a position and a velocity of the stage at the start of the next exposure to the second exposure shot;

(3) the velocity of the stage does not exceed the input upper limit velocity value;
(4) the acceleration of the stage does not exceed the input upper limit acceleration value; and
(5) the time required for jerk does not fall below a lower limit value.

4. The exposure apparatus according to claim 1, wherein the target locus between the exposure to the first exposure shot and the next exposure to the second exposure shot starts with a uniform motion and ends with a uniform motion.

5. The exposure apparatus according to claim 1, wherein the target locus between the exposure to the first exposure shot and the next exposure to the second exposure shot starts with a static motion and ends with a static motion.

6. A control method for controlling an exposure apparatus that exposes a plurality of exposure shots on a substrate and includes a stage configured to hold the substrate and a driving unit configured to drive the stage, the method comprising:
inputting an arrangement of exposure shots and an exposure order;
inputting an upper limit acceleration value and an upper limit velocity value of the stage;
creating a target locus of the stage using constrained-quadratic-linear programming for deriving a driving time of the stage so that the driving time of the stage from an end of an exposure to a first exposure shot through a start of a next exposure to a second exposure shot as a target function falls within an acceptable value range, based on constraint conditions including the input arrangement of exposure shots and exposure order, the input upper limit acceleration value and upper limit velocity value, and a lower limit of a time required for jerk of the stage; and
controlling the driving unit based on the created target locus.

7. A device fabrication method comprising:
exposing a substrate using an exposure apparatus; and
performing a development process for the substrate exposed,
wherein the exposure apparatus includes:
a stage configured to hold the substrate;
a driving unit configured to drive the stage;
a processor configured to create a target locus of the stage; and
a control unit configured to control the driving unit based on the target locus created by the processor,
wherein the processor creates the target locus using constrained-quadratic-linear programming for deriving a driving time of the stage so that the driving time from an end of an exposure of a first exposure shot to a start of a next exposure of a second exposure shot as a target function falls within an acceptable range, and
wherein the constrained-quadratic-linear programming is executed under constrained conditions of an arrangement of the exposure shots, an exposure order of the exposure shots, an upper limit of a velocity of the stage, an upper limit of an acceleration of the stage, and a lower limit of a time required for jerk of the stage.

8. The exposure apparatus according to claim 1, wherein the processor creates the target locus using the constrained-quadratic-linear programming under the constrained condition to minimize the driving time from the end of the exposure of the first exposure shot to the start of the next exposure of the second exposure shot.

* * * * *